United States Patent
Reeves

(10) Patent No.: US 8,255,349 B2
(45) Date of Patent: Aug. 28, 2012

(54) AUTOMATED DESIGN OF COMPUTER SYSTEM ARCHITECTURE

(75) Inventor: John D. Reeves, Keller, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1114 days.

(21) Appl. No.: 12/136,522

(22) Filed: Jun. 10, 2008

(65) Prior Publication Data

US 2009/0307171 A1  Dec. 10, 2009

(51) Int. Cl.
 *G06F 17/00* (2006.01)
 *G06N 5/02* (2006.01)
(52) U.S. Cl. .................. 706/47; 703/1; 709/203
(58) Field of Classification Search .......... 706/47
 See application file for complete search history.

(56) References Cited

U.S. PATENT DOCUMENTS

| | | | |
|---|---|---|---|
| 6,917,909 B1 | 7/2005 | Markov et al. | 703/14 |
| 7,076,417 B2 | 7/2006 | Jain et al. | 703/20 |
| 2003/0154347 A1* | 8/2003 | Ma et al. | 711/131 |
| 2007/0074148 A1* | 3/2007 | Morgan | 717/101 |

* cited by examiner

*Primary Examiner* — Kakali Chaki
*Assistant Examiner* — Kalpana Bharadwaj

(57) ABSTRACT

In certain embodiments, a method includes accessing a number of target values. Each target value may be associated with a respective design criterion of a computer system. The computer system may be associated with one or more domains. Each domain may be associated with a respective function of the computer system. The method may include determining, based at least in part on a first set of one or more of the number of target values, a respective implementation pattern for each of the one or more domains. The one or more determined implementation patterns may represent a logical architecture for the computer system. The method may include determining a physical architecture for the computer system by determining a respective solution stack for each of the one or more determined implementation patterns based at least in part on a second set of one or more of the plurality of target values.

19 Claims, 5 Drawing Sheets

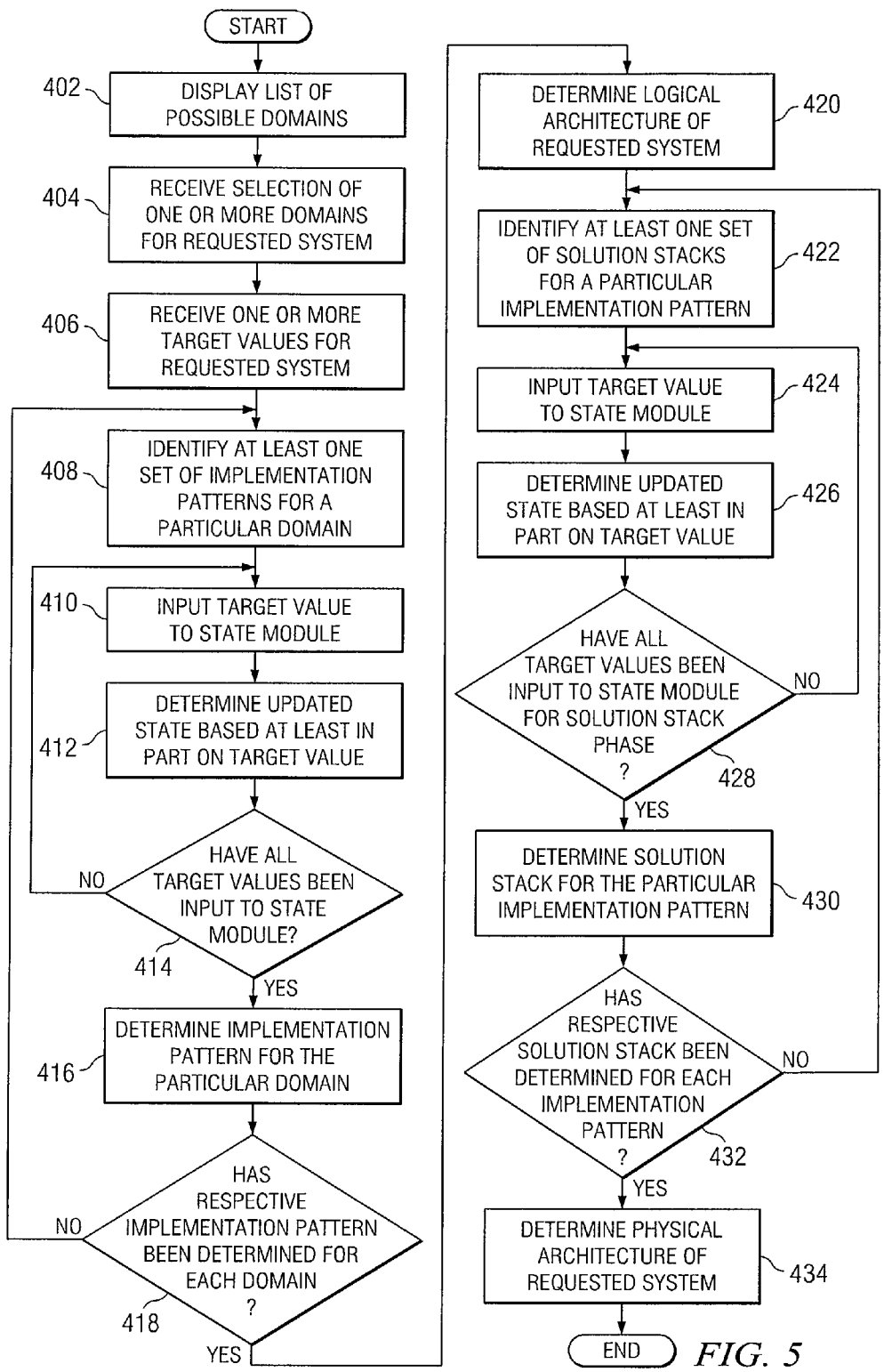

AUTOMATED DESIGN OF COMPUTER SYSTEM ARCHITECTURE

TECHNICAL FIELD

The present invention relates generally to information technology (IT) systems and more particularly to designing computer system architecture.

BACKGROUND

Traditionally, enterprise computer systems have been designed by individual architects based on non-deterministic architectural models. In designing these computer systems, individual architects have generally exercised their own judgment in choosing among design options or in developing new design options. Different architects have often imparted their own unique style and artistic preferences to the design of computer systems. Computer systems designed by different architects according to these strictly judgment-based traditional techniques may have architectural differences that increase the cost of maintaining, upgrading, and/or integrating the computer systems. Furthermore, because the traditional design process has been based on the discretion and/or artistic style of the architect, this process has not yielded predictable results.

SUMMARY OF THE INVENTION

According to the present invention, disadvantages and problems associated with previous techniques for designing computer system architecture may be reduced or eliminated.

In certain embodiments, a system includes a memory operable to store a number of target values. Each target value may be associated with a respective design criterion of a computer system to be designed. The computer system may be associated with one or more domains, and each domain may be associated with a respective function of the computer system. The system may further include a processor operable to determine a respective implementation pattern for each of the one or more domains. The determination may be based at least in part on a first set of one or more of the plurality of target values. The one or more determined implementation patterns may represent a logical architecture for the computer system. The processor is further operable to determine a physical architecture for the computer system. Determining the physical architecture may include determining a respective solution stack for each of the one or more determined implementation patterns based at least in part on a second set of one or more of the number of target values.

In certain embodiments, a method includes accessing a number of target values. Each target value may be associated with a respective design criterion of a computer system. The computer system may be associated with one or more domains. Each domain may be associated with a respective function of the computer system. The method may include determining, based at least in part on a first set of one or more of the number of target values, a respective implementation pattern for each of the one or more domains. The one or more determined implementation patterns may represent a logical architecture for the computer system. The method may include determining a physical architecture for the computer system by determining a respective solution stack for each of the one or more determined implementation patterns based at least in part on a second set of one or more of the plurality of target values.

Certain embodiments of the present invention may offer one or more advantages. In certain embodiments, a design system may include a state machine that generates the architecture for a computer system based at least in part on design rules that conform to standardized guidelines and/or best practices. The design system may thereby ensure that the design of each computer system for each customer is based on consistent and accepted architectural principles. Thus, the design system may generate consistent and predictable architectures for different computer systems. Another advantage may be that, by designing computer systems with a state machine that consistently applies design rules, the time and cost associated with designing computer systems may be reduced. Additionally or alternatively, the time and cost for subsequently maintaining, upgrading, and/or integrating the computer systems may be reduced.

Certain embodiments of the present invention may provide some, all, or none of the above advantages. Certain embodiments may provide one or more other technical advantages, one or more of which may be readily apparent to those skilled in the art from the figures, descriptions, and claims included herein.

BRIEF DESCRIPTION OF THE DRAWINGS

To provide a more complete understanding of the present invention and the features and advantages thereof, reference is made to the following description taken in conjunction with the accompanying drawings, in which:

FIG. 5 illustrates a flowchart of a method for determining the logical and physical architecture of the computer system, according to certain embodiments of the present invention.

DESCRIPTION OF EXAMPLE EMBODIMENTS

Figure 1:
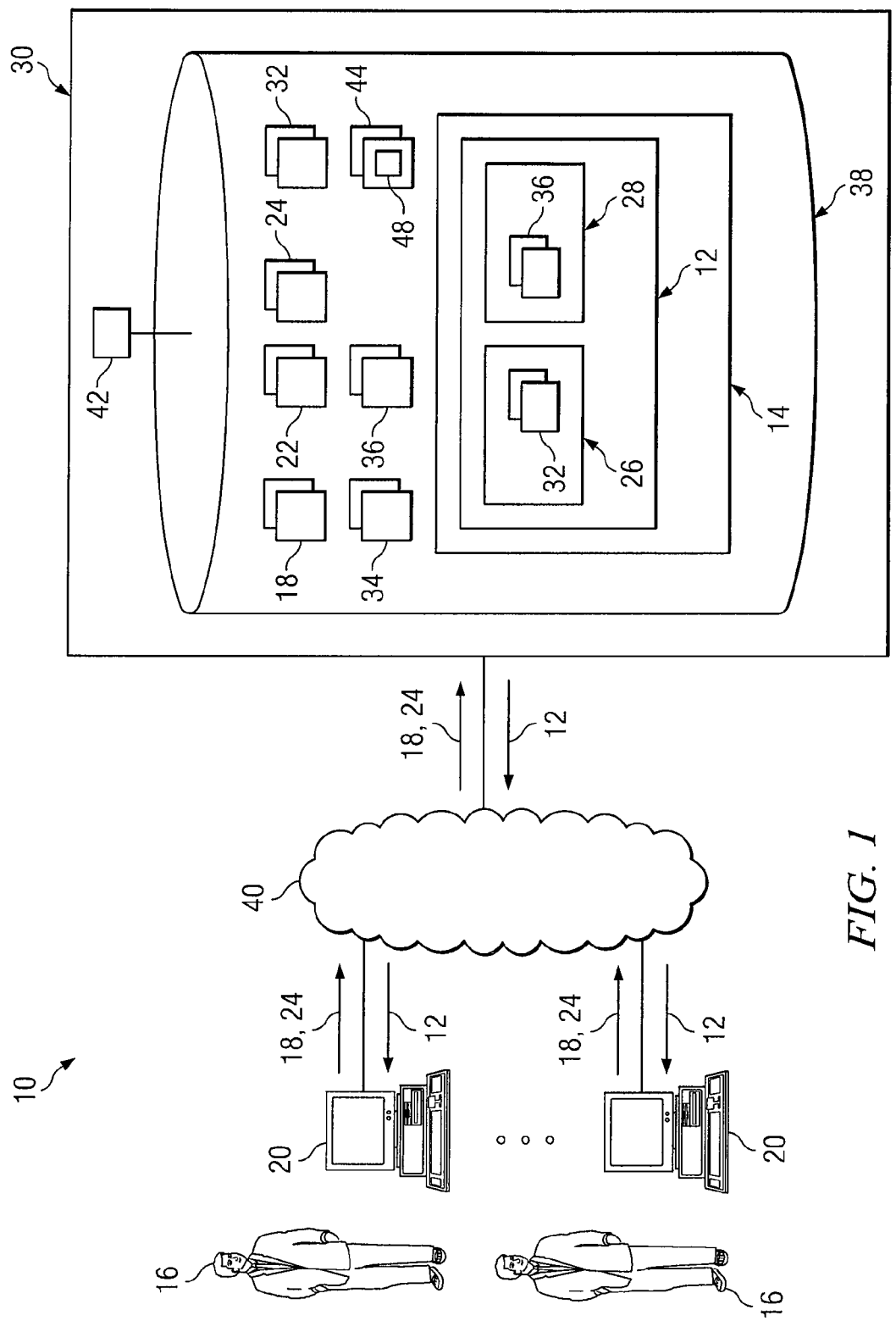
FIG. 1 illustrates an example system for designing an architecture for a computer system, according to certain embodiments of the present invention.

FIG. 1 illustrates an example system 10 for designing an architecture 12 for a computer system, according to certain embodiments of the present invention. The computer system for which architecture 12 is to be designed may be referred to as requested system 14. Requested system 14 may be any suitable type of computer system that a user 16 requests to buy, build, implement, and/or upgrade. System 10 may design any suitable type of requested system 14 such as, for example, an enterprise system, a distributed system, a centralized system, an N-tier system, a client-server system, a mainframe system, a supercomputer system, and/or any suitable type of computer system. System 10 may determine architecture 12 for requested system 14 based at least in part on requirements submitted by user 16. Architecture 12 may be a detailed plan which describes the structure and type of components for requested system 14, the organization and interrelationship of the components for requested system 14, and/or the guidelines for building and implementing requested system 14.

System 10 may include a number of clients 20 coupled to a design server 30 via one or more networks 40.

Client 20 represents any suitable local or remote end-user device that facilitates communication between users 16 and design server 30. Client 20 is generally operable to receive from users 16 information regarding the design of requested system 14. The information received from users 16 may include target values 18 for design criteria 22 of requested system 14. Design criteria 22 may refer to constraints, standards, objectives, goals, and/or requirements for the implementation, performance, operation, integration, cost, and/or maintenance of requested system 14. Design server 30 may use any suitable type and/or combination of design criteria 22 to determine architecture 12 for requested system 14. For example, design criteria 22 may include the maximum number of users 16 of requested system 14, the acceptable latency in requested system 14, the type of authentication to be used in requested system 14, the type of platform to be executed by requested system 14, the number of back-end integrations to be associated with requested system 14, the frequency of upgrades or modifications to requested system 14, and/or any suitable characteristic of requested system 14.

For each design criterion 22 associated with requested system 14, user 16 may input into client 20 one or more target values 18. Target value 18 may represent a predicted or desired value for a constraint, standard, objective, goal, and/or requirement for the implementation, performance, operation, integration, cost, and/or maintenance of requested system 14. For example, target value may be a characteristic and/or performance level of requested system 14. As a particular example, for design criterion 22 of maximum cost, user 16 may input target value 18 of $500,000 if the budget for requested system 14 is limited to $500,000. As another particular example, for design criterion 22 of maximum acceptable latency, user 16 may input target value 18 of "less than two seconds" if requested system 14 is required to respond to user queries within two seconds. Although particular design criteria 22 and target values 18 are described above, design server 30 may use any suitable type and combination of design criteria 22 and/or target values 18. Additionally, target values 18 may be numeric, non-numeric, or a combination of numeric and non-numeric, according to particular needs.

In certain embodiments, client 20 is operable to receive from users 16 information regarding the domains 24 of requested system 14. Domain 24 generally refers to one or more functions of requested system 14. In certain embodiments, each domain 24 is directed to a different type of function or group of functions. For example, one domain 24 of requested system 14 may include function(s) associated with data management and extraction. Another domain 24 of requested system 14 may include function(s) associated with executing, authenticating, and managing online transactions. Other examples of domains 24 may include, but are not limited to, a business process domain 24, an applications integration domain 24, a security domain 24, and/or any suitable types of function(s). Different functions may be classified in different domains 24 according to any suitable criteria.

In certain embodiments, requested system 14 includes a single domain 24. In other embodiments, requested system 14 includes multiple domains 24. For example, if requested system 14 is an enterprise system for an airline, requested system 14 may include a first domain 24 for ticketing and reservations, a second domain 24 for supply chain management, and a third domain 24 for data management. Different requested systems 14 may be designed to provide different domains 24. For example, a first requested system 14 may be associated with a first set of domains 24 and a second requested system 14 may be associated with a second set of different domains 24.

In certain embodiments, client 20 may include a user interface through which user 16 may input and/or select domains 24 of requested system 14. According to certain embodiments, client 20 may display to user 16 a list of possible domains 24 and user 16 may select the particular domains 24 to be provided by requested system 14. According to other embodiments, client 20 may display a list of functions, and user 16 may use client 20 to select the particular functions to be performed by requested system 14. Based at least in part on the selected functions, client 20 and/or design server 30 may determine the particular domains 24 of requested system 14. For example, if user 16 selects "online ticket sales" as a function to be performed by requested system 14, client 20 may determine "online transactions" as a domain 24 of requested system 14. By determining the particular domains 24 of requested system 14, the overall architecture 12 of requested system 14 may be divided into manageable subparts.

Client 20 may be any suitable local or remote end-user device. A particular client 20 may comprise a computer, workstation, telephone, Internet browser, electronic notebook, Personal Digital Assistant (PDA), pager, and/or any other suitable device (wireless, wireline, or otherwise), component, or element capable of receiving, processing, storing, and/or communicating information with other components of system 10. Client 20 may also comprise any suitable user interface such as a display, microphone, keyboard, or any other appropriate terminal equipment according to particular configurations and arrangements. It will be understood that system 10 may comprise any number and combination of clients 20.

Client 20 may be used by any suitable type of user 16. In certain embodiments, user 16 may be a customer who desires to purchase requested system 14. In other embodiments, user 16 may be an architect or technician who designs or configures requested system 14 on behalf of one or more customers.

Client 20 may be operable to transmit target values 18 and information regarding domains 24 to design server 30. Client 20 may be communicatively coupled to design server 30 via network 40. Design server 30 is generally operable to determine architecture 12 of requested system 14 based at least in part on target values 18 and/or domains 24 received from client 20. As described above, architecture 12 may be a detailed plan which describes the structure and type of components for requested system 14, the organization and interrelationship of the components for requested system 14, and/or the guidelines for building and implementing requested system 14. In certain embodiments, architecture 12 may comprise a logical architecture 26 and a physical architecture 28 of requested system 14.

Logical architecture 26 may refer to a plan for the structure and organization of requested system 14 in which components are described generically. Thus, logical architecture 26 of requested system 14 may describe a plan that is agnostic to vendor-specific hardware and/or software products for requested system 14. Logical architecture 26 may include one or more implementation patterns 32. Implementation pattern 32 represents an architectural option for implementing domain 24 in requested system 14 according to best practices in a given industry or other suitable preferences. Implementation pattern 32 may be a pattern for structuring and/or interfacing generic components in requested system 14.

For each domain 24 of requested system 14, design server 30 may determine, based at least in part on target values 18, a respective implementation pattern 32 from a set of implementation patterns 32. For example, a particular domain 24 of requested system 14 may be online transactions. Design server 30 may store a set of implementation patterns 32 that are associated with the online transaction domain 24. The set of implantation patterns may include an N-tier pattern, a client-server pattern, a mainframe pattern, and/or any suitable pattern for implementing at least a portion of requested system 14. In this example, design server 30 processes target values 18 received from client 20 and determines that the client-server pattern is the appropriate and/or optimal implementation pattern 32 for the online transaction domain 24 of requested system 14. Although the foregoing example describes particular implementation patterns 32 associated with a particular domain 24, it should be understood that design server 30 may store any suitable types and/or combinations of implementation patterns 32.

In certain embodiments, design server 30 may store a respective set of implementation patterns 32 for each domain 24 that may be selected and/or input by user 16. The particular implementation patterns 32 associated with a given domain 24 may be determined according to industry-accepted best practices. As best practices or other suitable preferences in a given industry evolve, the particular implementation patterns 32 associated with the given domain 24 may be updated in system 10. For each domain 24 of a particular requested system 14, design server 30 may determine the appropriate and/or optimal implementation pattern 32 by applying design rules 34 to target values 18. An example process of applying design rules 34 to target values 18 is described in further detail with respect to FIG. 4.

To determine logical architecture 26 of requested system 14, design server 30 may determine a respective implementation pattern 32 for each domain 24 of requested system 14. Accordingly, where requested system 14 includes a number of domains 24, logical architecture 26 of requested system 14 may include a number of implementation patterns 32. Design server 30 may determine different implementation patterns 32 for different domains 24. For example, requested system 14 may include a data management domain 24 and an application integration domain 24. In this example, design server 30 may determine that a mainframe pattern is the appropriate implementation pattern 32 for the data management domain 24. For the application integration domain 24, design server 30 may determine that a client-server pattern is the appropriate implementation pattern 32.

As described above, implementation pattern 32 may be a pattern for structuring and/or interfacing components that are described generically (e.g., "server," "mainframe," "application program interface," etc.) rather than specifically with respect to particular vendors (e.g., Oracle, IBM, SAP, etc.). Because implementation pattern 32 may be associated with generic rather than vendor-specific components, implementation pattern 32 represents at least part of logical architecture 26 of requested system 14.

Design server 30 is further operable to determine a physical architecture 28 for requested system 14 based at least in part on the determined logical architecture 26 for requested system 14. Physical architecture 28 may be a plan that describes the organization of vendor-specific hardware and/or software components in requested system 14. Physical architecture 28 may include one or more solution stacks 36. Solution stack 36 refers to any suitable vendor-specific hardware, software, and firmware components implementing a particular implementation pattern 32. Each implementation pattern 32 stored in design server 30 may be associated with a respective set of solution stacks 36. For each implementation pattern 32 in logical architecture 26 determined for requested system 14, design server 30 may determine an appropriate solution stack 36 based at least in part on target values 18 received from client 20.

For example, requested system 14 may include a web portal domain 24. In this example, design server 30 may generate logical architecture 26 by determining that an N-tier pattern is the appropriate implementation pattern 32 for the web portal domain 24 of requested system 14. In certain embodiments, design server 30 may determine that the N-tier pattern is the optimal implementation pattern 32. Design server 30 may then determine physical architecture 28 of requested system 14 based at least in part on the determined implementation pattern 32 and target values 18.

In this example, design server 30 may store information regarding solution stacks 36 that are operable to implement the N-tier implementation pattern 32. A first solution stack 36 may include a presentation client, an application server, and a database management system offered by a first vendor (e.g., Oracle). A second solution stack 36 may include a front-end server, a middleware server, and a database management system offered by a second vendor (e.g., SAP). A third solution stack 36 may include a presentation client offered by the first vendor, an application server offered by the second vendor, and a database management system offered by a third vendor (e.g., IBM). Based at least in part on target values 18 received from client 20, design server 30 may determine which of the first, second, and third solution stacks 36 is the appropriate solution stack 36 to implement the N-tier implementation pattern 32 for the web portal domain 24 in requested system 14.

Although the foregoing example describes particular vendors and particular solution stacks 36, it should be understood that design server 30 may store information regarding any suitable solution stack 36 with components from any suitable number and/or combination of vendors.

In certain embodiments, design server 30 stores information regarding a respective set of solution stacks 36 for each implementation pattern 32 stored in design server 30. The particular solution stacks 36 associated with a given implementation pattern 32 in design server 30 may be determined according to industry-accepted best practices. For example, an industry-accepted best practice to implement a Java-based web server may be to use a Sun Java System Application Server. As best practices in a given industry evolve, design server 30 may update the particular solution stacks 36 associated with the given implementation pattern 32. Furthermore, as vendors update and/or offer new hardware, software, and/or firmware products, information regarding solution stacks 36 that is stored in design server 30 may be updated. In certain embodiments, prior to including a particular solution stack 36 in physical architecture 28, design server 30 may verify that the vendor-specific hardware, software, and/or firmware components in the particular solution stack 36 have (individually and/or in combination) satisfied various testing requirements. For each implementation pattern 32 in logical architecture 26 of requested system 14, design server 30 may determine the appropriate solution stack 36 by applying design rules 34 to target values 18. An example process of applying design rules 34 to target values 18 is described in further detail with respect to FIG. 4.

To determine physical architecture 28, design server 30 may determine different solution stacks 36 for different implementation patterns 32 in logical architecture 26 of requested system 14. For example, logical architecture 26 of requested system 14 may include a client-server implementation pattern 32 for a first domain 24 and a client-server implementation pattern 32 for a second domain 24. In this example, based at least in part on target values 18 received from client 20, design server 30 may determine that a particular solution stack 36 (e.g., solution stack 36 from a first vendor) is appropriate for the first domain 24 of requested system 14 and a different solution stack 36 (e.g., solution stack 36 from a second vendor) is appropriate for the second domain 24 of requested system 14.

Design server 30 may output the determined architecture 12 of requested system 14 in any suitable format. For example, design server 30 may output the determined architecture 12 as an image file, a data file, a text file, and/or any suitable electronic file. Design server 30 may cause a graphical user interface of client 20 to display the determined architecture 12 to user 16. Graphical user interface of client 20 may display the determined architecture 12 as a virtual diagram or blueprint that includes text, images, and/or symbols depicting the structure, organization, and/or interfaces of hardware, software, and/or firmware components of requested system 14. In certain embodiments, design server 30 may embody the determined architecture 12 as a documentation suite that includes documents detailing product and/or network requirements of requested system 14, configuration specifications, maintenance guidelines, and/or instructions for building requested system 14. The documentation suite may be transmitted to user 16 in any suitable electronic format. Additionally or alternatively, client 20 and/or design server 30 may cause a printer to generate a hard-copy version of the documentation suite.

Design server 30 in system 10 may include any suitable combination of hardware, software, and/or firmware implemented in one or more modules to provide the described functions and operations. In certain embodiments, design server 30 may include a general-purpose personal computer (PC), a Macintosh, a workstation, a Unix-based computer, a server computer, or any suitable processing device or devices. In certain embodiments, the functions and operations described above may be performed by a pool of multiple design servers 30. A particular design server 30 may include a memory 38 and processor 42.

Memory 38 may include any suitable arrangement of random access memory (RAM), read only memory (ROM), magnetic computer disk, CD-ROM, or other magnetic or optical storage media, or any other volatile or non-volatile memory devices that store one or more files, lists, tables, or other arrangements of information such as target values 18. Although FIG. 1 illustrates memory 38 as internal to design server 30, it should be understood that memory 38 may be internal or external (or both) to design server 30, depending on particular implementations. Also, memory 38 may be separate from or integral to other memory devices to achieve any suitable arrangement of memory devices for use in system 10. Additionally, although memory 38 is referred to primarily in the singular, design server may include or otherwise be associated with any suitable number and types of memory 38.

Memory 38 is generally operable to store target values 18, domains 24, implementation patterns 32, information regarding solution stacks 36, logical architecture 26, and physical architecture 28 of requested system 14. Memory 38 is further operable to store design rules 34 and state module 44. Design rules 34 generally represent rules, tables, algorithms, code, guidelines, and/or instructions for determining implementation patterns 32 and/or solution stacks 36 for requested system 14 based at least in part on target values 18.

Design rules 34 may be based at least in part on any suitable architectural standards and/or guidelines. For example, design rules 34 may be based on TOGAF (The Open Group Architecture Framework), the Zachman Framework, the RightStep guidelines, the Rational Unified Process (RUP), and/or any suitable framework or standard. In certain embodiments, design rules 34 may be customized by user 16 (or another suitable user) to satisfy the particular objectives of requested system 14. Design server 30 may apply one or more target values 18 to one or more design rules 34 to determine implementation pattern 32 and/or solution stack 36 for requested system 14. For example, memory 38 may store design rule 34 which specifies that if maximum concurrent number of users 16 is greater than one thousand, then the appropriate implementation pattern 32 is N-tier. It should be understood that memory 38 may store any number and/or combination of design rules 34.

In certain embodiments, state module 44 may access design rules 34. According to certain embodiments, state module 44 may include code, rules, instructions, and/or logic that may be executed by processor 42 to provide a virtual state machine, neural network, and/or artificial intelligence network. In other embodiments, state module 44 may include one or more circuits, gates, flip flops, relays, and/or transducers that operate as a state machine. According to certain embodiments, state module 44 may be one or more actual and/or virtual finite state machines or other automata that is deterministic or non-deterministic.

Processor 42 may execute state module 44 to determine logical architecture 26 and/or physical architecture 28 of requested system 14 based at least in part on target values 18 and/or design rules 34. For example, state module 44 may include a virtual state machine that, given an input, proceeds through a series of states 48 according to a transition function (which can be expressed as a table, according to certain embodiments of the present invention). States 48 associated with state module 44 may correspond to implementation patterns 32 and/or solution stacks 36. Given a current state 48 (e.g., implementation pattern 32 or solution stack 36) and a current input (e.g., target value 18), the transition function may specify the next state 48 (e.g., implementation pattern 32 or solution stack 36). With respect to automata theory, the transition function may direct an automaton regarding which state 48 to go to next. In certain embodiments, transition functions are based at least in part on design rules 34 in memory 38.

Memory 38 may be communicatively coupled to one or more processors 42. Processor 42 is generally operable to execute state module 44, design rules 34, and/or other logic stored in memory 38 to generate architecture 12 for requested system 14. Processor 42 may include any suitable combination of hardware, firmware, and/or software implemented in one or more modules to provide the described function or operation. Processor 42 may include one or more microprocessors, controllers, or any other suitable computing devices or resources. Processor 42 may work, either alone or with other components of system 10 to provide the functionality of system 10 described herein. Additionally, although processor 42 is referred to primarily in the singular, design server may include or otherwise be associated with any suitable number and types of processors 42.

Design server 30 may be communicatively coupled to clients 20 via one or more networks 40. Network 40 facilitates wireless or wireline communication. Network 40 may communicate, for example, IP packets, Frame Relay frames, Asynchronous Transfer Mode (ATM) cells, voice, video, data, and other suitable information between network addresses. Network 40 may include one or more local area networks (LANs), radio access networks (RANs), metropolitan area networks (MANs), wide area networks (WANs), all or a portion of the global computer network known as the Internet, and/or any other communication system or systems at one or more locations.

It should be understood that the internal structure of system 10 and the servers, processors, and memory devices associated therewith is malleable and can be readily changed, modified, rearranged, or reconfigured to achieve the intended operations of system 10.

In operation of an example embodiment of system 10, user 16 may use client 20 to transmit to design server 30 a command to design requested system 14. User 16 may input into client 20 target values 18 that define, at least in part, the desired characteristics (e.g., requirements) of requested system 14. User 16 may further use client 20 to define one or more domains 24 of requested system 14. In certain embodiments, user 16 may select one or more domains 24 from a list of possible domains 24 displayed by client 20. Client 20 may transmit to design server 30 the particular target values 18 and domains 24 that were input by user 16.

Design server 30 may store the received target values 18 and domains 24 for requested system 14 in memory 38. In certain embodiments, the received target values 18 and domains 24 may be stored in memory 38 in a profile associated with the particular user 16 and/or the particular requested system 14. For each domain 24 of requested system 14, design server 30 may determine a respective implementation pattern 32 from a set of implementation patterns 32 stored in memory 38. The determination may be based at least in part on the received target values 18 and one or more design rules 34 stored in memory 38. The combination of the implementation patterns 32 determined for domains 24 of requested system 14 may be referred to as logical architecture 26 of requested system 14.

Design server 30 may then determine physical architecture 28 for requested system 14. In particular, for each implementation pattern 32 in logical architecture 26 of requested system 14, design server 30 may determine a respective solution stack 36 from a set of solution stacks 36 stored in memory 38. The determination may be based at least in part on the received target values 18 and one or more design rules 34 stored in memory 38. The combination of solution stacks 36 determined for implementation patterns 32 in logical architecture 26 may be referred to as physical architecture 28 of requested system 14. Design server 30 may transmit to client 20 the determined physical architecture 28 according to any suitable format.

Figure 2:
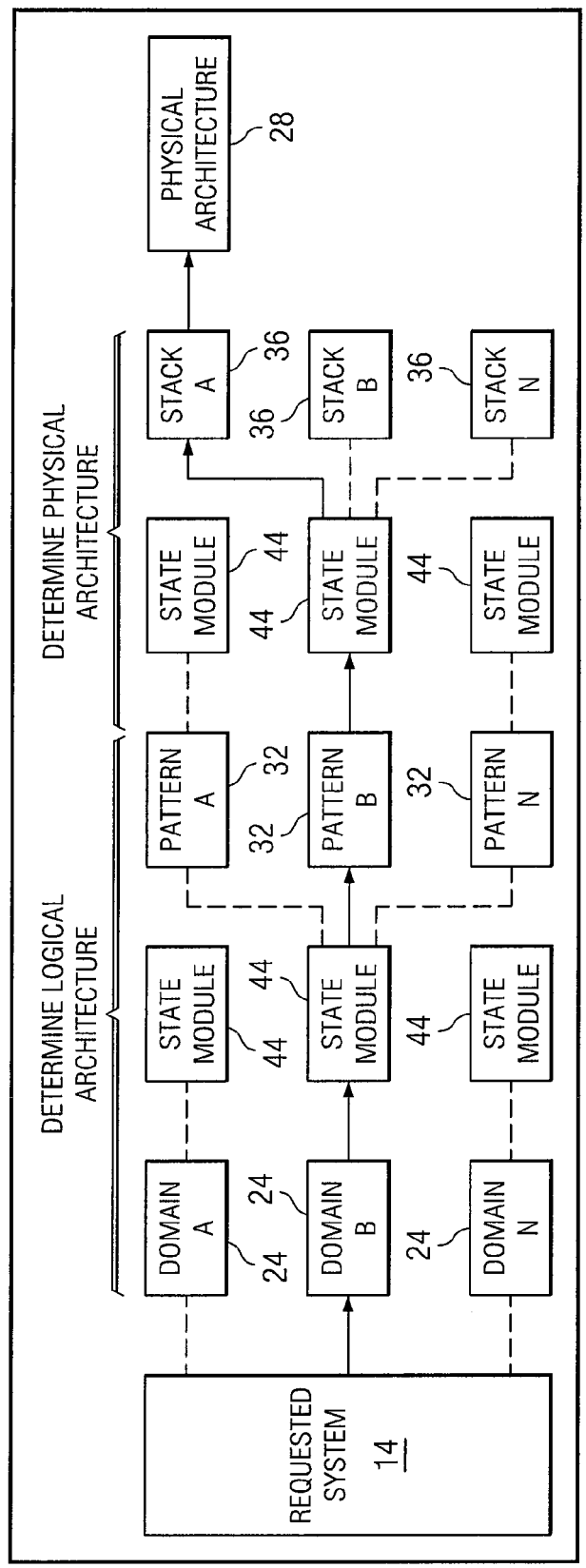
FIG. 2 illustrates an example flow of operation for determining an architecture for a requested system, according to certain embodiments of the present invention.

FIG. 2 illustrates an example flow of operation for determining physical architecture 28 for requested system 14, according to certain embodiments of the present invention. In this example, user 16 may submit a request to design server 30 to generate architecture 12 for requested system 14. In conjunction with submitting the request, user 16 may specify one or more domains 24 of requested system 14. In this example, user 16 specifies that requested system 14 should include multiple domains 24—specifically, Domain A through Domain N.

For each domain 24 associated with requested system 14, design server 30 may determine a respective implementation pattern 32 from at least one set of implementation patterns 32. To determine the appropriate implementation pattern 32 for a given domain 24, design server 30 may input one or more target values 18 into state module 44. Based at least in part on design rule(s) 34 and target value(s) 18, state module 44 may determine an appropriate implementation pattern 32 for the given domain 24. In the illustrated example, design server 30 determines the appropriate implementation pattern 32 for Domain B of requested system 14. Based on design rule(s) 34 and target value(s) 18, state module 44 in design server 30 determines that, from among the set of possible implementation patterns 32 (e.g., Implementation patterns A though N), Implementation Pattern B is an appropriate implementation pattern 32 for Domain B. As explained above, design server 30 may determine a respective implementation pattern 32 for each domain 24 of requested system 14. The determined implementation patterns 32 for requested system 14 may represent logical architecture 26 for requested system 14.

Once design server 30 determines logical architecture 26 for requested system 14, design server 30 may determine physical architecture 28 for requested system 14. For each implementation pattern 32 in the determined logical architecture 26, design server 30 may determine a respective solution stack 36 from at least one set of solution stacks 36. To determine the appropriate solution stack 36 for a given implementation pattern 32, design server 30 may apply design rule(s) 34 to target value(s) 18 from user 16. In the illustrated example, design server 30 determines the appropriate solution stack 36 for Implementation Pattern B of requested system 14. Based on design rule(s) 34 and target value(s) 18, state module 44 in design server 30 determines that, from among the set of possible solution stacks 36 (e.g., Solution Stacks A through N), Solution Stack A is an appropriate solution stack 36 for Implementation Pattern B. As explained above, design server 30 may determine a respective solution stack 36 for each implementation pattern 32 in logical architecture 26 for requested system 14. The determined solution stacks 36 may represent physical architecture 28 for requested system 14.

Figure 3:
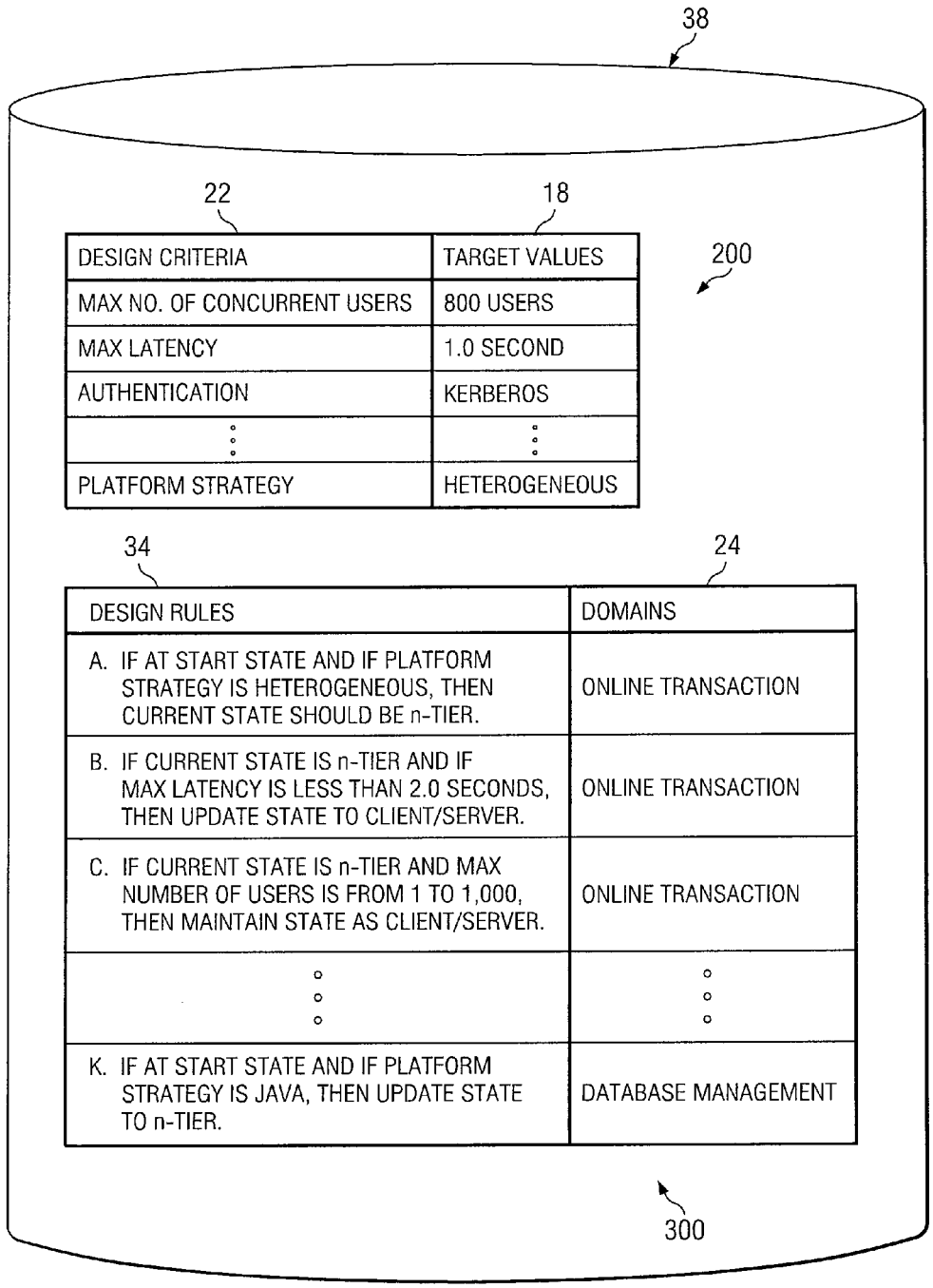
FIG. 3 illustrates example target values, design criteria, and design rules stored in memory in a design server, according to certain embodiments of the present invention.

FIG. 3 illustrates example target values 18, design criteria 22, and design rules 34 stored in memory 38 in design server 30, according to certain embodiments of the present invention. In particular, chart 200 in memory 38 includes example design criteria 22 associated with example target values 18 received from client 20. To populate chart 200 with target values 18, design server 30 may cause client 20 to display design criteria 22 to user 16. In response, user 16 may input a respective target value 18 for each design criterion 22 displayed by client 20. Client 20 may display design criteria 22 simultaneously or sequentially. In certain embodiments, client 20 may present application wizard(s) and/or dialogue box(es) that lead user 16 through the steps of inputting a respective target value 18 for each design criterion 22.

In the illustrated example, user 16 submitted to client 20 respective target values 18 for each design criterion 22 in chart 200. The first design criterion 22—maximum number of concurrent users 16 of requested system 14—is associated with target value 18 of eight hundred. The second design criterion 22—maximum acceptable latency—is associated with target value 18 of one second. The third design criterion 22—required authentication type—is associated with target value 18 of "Kerberos." The last design criterion 22—platform strategy—is associated with target value 18 of "heterogeneous."

Although particular design criteria 22 and target values 18 are illustrated in chart 200, it should be understood that design server 30 may store any suitable target values 18 for any suitable number and/or combination of design criteria 22. For example, design criteria 22 may include the estimated number of backend integrations between requested system 14 and existing applications and/or systems, the estimated number of archived records to be stored in requested system 14, the estimated frequency of changes and/or upgrades to software in requested system 14, and/or any other suitable criteria.

Memory 38 may further store design rules 34 for determining architecture 12 of requested system 14 based at least in part on target values 18. In the illustrated example, chart 300 in memory 38 includes multiple design rules 34. For example, Design Rule A specifies that, if design criterion 22 of platform strategy is associated with target value 18 of heterogeneous, then implementation pattern 32 should be an N-tier pattern. Design Rule B specifies that, if the current state 48 for implementation pattern 32 is an N-tier pattern and if design criterion 22 of maximum acceptable latency is associated with target value 18 that is less than two seconds, then implementation pattern 32 should be a client-server pattern. Design Rule C specifies that, if the current state 48 for implementation pattern 32 is an N-tier pattern and if design criterion 22 for the maximum number of users 16 is associated with target value 18 between one and one thousand, then implementation pattern 32 should be a client-server pattern.

Processor 42 may be configured to process design rules 34 in a particular sequence. The particular architecture 12 of requested system 14 may depend at least in part on the sequence in which processor 42 applies design rules 34 to target values 18. For example, the result of processing a second design rule 34 may cause processor 42 to deviate from state 48 (e.g., implementation pattern 32 or solution stack 36) specified by a first design rule 34. Although the foregoing example illustrates particular target values 18, design rules 34, and implementation patterns 32, design server 30 may apply any suitable target values 18 to any number and combination of design rules 34. Design rules 34 may specify any type and combination of implementation patterns 32 and/or solution stacks 36.

In certain embodiments, chart 300 may be configured such that different design rules 34 are mapped to different domains 24 of requested system 14. For example, Design Rule A, which relates to platform strategy, is mapped to an online transaction domain 24. Thus, to determine implementation pattern 32 and/or solution stack 36 for the online transaction domain 24 of requested system 14, design server 30 may apply Design Rule A in chart 300. In this example, chart 300 includes another design rule 34 (i.e., Design Rule K) regarding platform strategy. Design Rule K is mapped to a database management domain 24. Design Rule K specifies that, if design criterion 22 of platform strategy is associated with target value 18 of Java, then implementation pattern 32 should be an N-tier pattern. Thus, to determine implementation pattern 32 and/or solution stack 36 for a database management domain 24 of requested system 14, design server 30 may apply Design Rule K instead of Design Rule A.

The mapping of design rules 34 to domains 24 in memory 38 may be based on any suitable criteria. In certain embodiments, the mapping of design rules 34 to domains 24 may be based on the best practices recognized in a particular industry. According to certain embodiments, design server 30 may permit user 16 to customize the mapping of design rules 34 to domains 24 of requested system 14. User 16 may input the mapping of design rules 34 to domains 24 of requested system 14 before, during, or after inputting target values 18 for requested system 14. Design server 30 may further permit user 16 to modify, delete, and/or add design rules 34 to memory 38. Thus, in certain embodiments, user 16 may customize the design rules 34 and/or mappings by which design server 30 generates architecture 12 for requested system 14.

In certain embodiments, processor 42 in design server 30 may apply design rules 34 to target values 18 iteratively or simultaneously to determine implementation patterns 32 and/or solutions stacks for architecture 12 of requested system 14.

In certain embodiments, processor 42 executes state module 44 to determine architecture 12. Thus, processor 42 may operate as a virtual state machine by applying design rules 34 to target values 18. Each state 48 in state module 44 may correspond to a possible implementation pattern 32 and/or solution stack 36. In certain embodiments, processor 42 identifies a start state 48 and, based on the result of applying the first design rule 34 to one or more target values 18, processor 42 may update the start state 48 to an intermediate state 48. Processor 42 may then apply the second design rule 34 to one or more target values 18 to determine whether to update the current state 48. Based at least in part on the final state 48 after applying the last design rule 34 to one or more target values 18, processor 42 may determine a particular implementation pattern 32 and/or solution stack 36 for a particular domain 24 of requested system 14.

Figure 4:
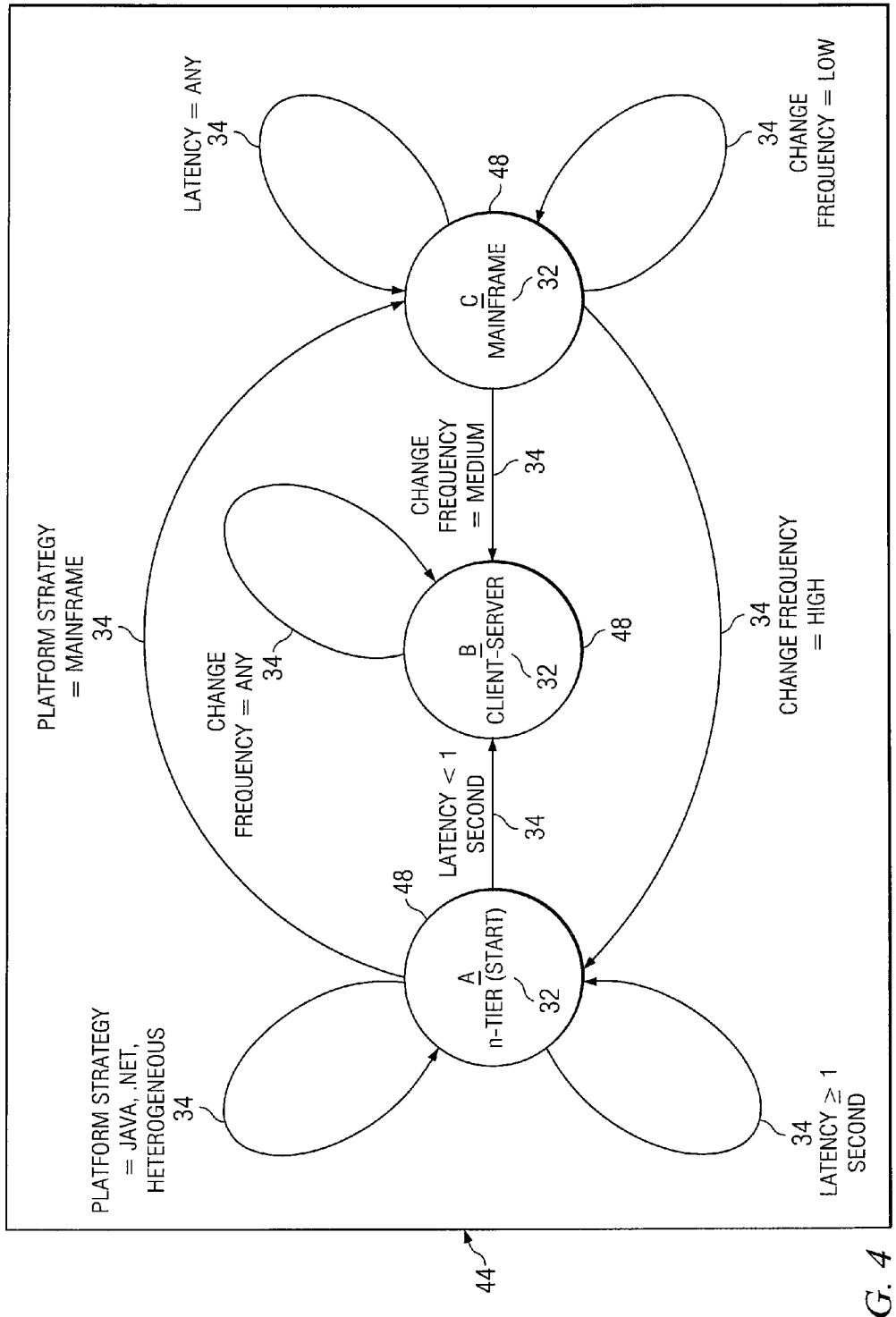
FIG. 4 illustrates an example flow of operation for determining an implementation pattern of the computer system, according to certain embodiments of the present invention.

FIG. 4 illustrates an example flow of operation for determining an implementation pattern 32 of requested system 14, according to certain embodiments of the present invention. The illustrated operation may be performed by executing state module 44 in memory 38. As described above, design server 30 may determine an appropriate implementation pattern 32 for each domain 24 of requested system 14. In certain embodiments, design server 30 may determine the appropriate implementation pattern 32 from one or more finite sets of possible implementation patterns 32 stored in memory 38. Each of the possible implementation patterns 32 for a particular domain 24 may be represented as states 48. Design server 30 may apply target values 18 to design rules 34 to determine the appropriate state 48 (e.g., implementation pattern 32) for the particular domain 24.

A first example illustrates particular embodiments. In this example, design server 30 receives a request to determine architecture 12 for requested system 14 that includes an online transaction domain 24. For this domain 24, design server 30 may determine a particular implementation pattern 32 from among three possible implementation patterns 32. Each of the possible implementation patterns 32 is represented as a respective state 48. State A represents an N-tier implementation pattern 32. State B represents a client-server implementation pattern 32. State C represents a mainframe implementation pattern 32. In this example, State A (N-tier) is designated as the start state 48.

To determine the appropriate implementation pattern 32, design server 30 processes target values 18 for design criteria 22 according to a particular sequence. In this example, design server 30 first processes target value 18 for platform strategy. Design server 30 next processes target value 18 for latency (representing the maximum acceptable latency specified by user 16). Last, design server 30 processes target value 18 for change frequency (representing the estimated frequency of changes to software or code executed by requested system 14).

In the present example, user 16 submits target value 18 of "Java" for platform strategy, target value 18 of "less than one second" for latency, and target value 18 of "medium" for change frequency. Design server 30 begins at State A (N-tier) where, as illustrated, if target value 18 for platform strategy is "mainframe", then design server 30 updates the current state 48 from State A (N-tier) to State C (mainframe). However, if target value 18 for platform strategy is "Java", ".Net", or "heterogeneous", then the current state 48 remains State A (N-tier). Because target value 18 for platform strategy is "Java", the current state 48 remains State A (N-tier).

Design server 30 then processes target value 18 for design criterion 22 of latency. As illustrated with respect to State A (the current state 48), if target value 18 for latency is "less than one second", then design server 30 updates the current state 48 from State A (N-tier) to State B (client-server). However, if target value 18 for latency is greater than one second, then the current state 48 remains State A (N-tier). Because target value 18 for latency is less than one second, design server 30 updates the current state 48 from State A (N-tier) to State B (client-server).

Design server 30 next processes target value 18 for change frequency. As illustrated with respect to State B (the current state 48), for any target value 18 for change frequency, the current state 48 remains State B. Thus, the current state 48 (State B) is not changed. Design server 30 then determines whether any other target values 18 remain to be processed. Because no other target values 18 remain to be processed in this example, design server 30 determines that the current state 48 (State B) represents the appropriate implementation pattern 32. Accordingly, in this example, design server 30 determines that the client-server pattern is the appropriate implementation pattern 32 for the online transaction domain 24 of requested system 14. For the other domains 24 of requested system 14, design server 30 may perform a similar state analysis (based on the same or different design rules 34) to determine a respective implementation pattern 32. Design server 30 may then aggregate the determined implementation patterns 32 to form logical architecture 26 of requested system 14.

Thus, design server 30 may perform a state analysis to determine the appropriate or optimal implementation pattern 32 for a particular domain 24 of requested system 14. In a similar manner, design server 30 may perform a state analysis to determine the appropriate or optimal solution stack 36 for implementation pattern 32. To determine solution stack 36, each state 48 may correspond to at least one possible solution stack 36. For each implementation pattern 32 in logical architecture 26, design server 30 may perform a state analysis to determine a respective solution stack 36. Design server 30 may then aggregate the determined solution stacks 36 to form physical architecture 28 of requested system 14. By applying target values 18 to design rules 34 as shown above, design server 30 may provide an efficient, automated, and/or standardized process for generating architectures 12 for requested systems 14.

Although the foregoing example illustrates particular target values 18 and design rules 34, design server 30 may be configured to apply any suitable design rules 34 to any suitable number and/or combination of target values 18. Although the foregoing example illustrates particular implementation patterns 32, it should be understood that design server 30 may store any number and/or combination of implementation patterns 32.

FIG. 5 illustrates a flowchart of a method for determining logical architecture 26 and physical architecture 28 of requested system 14, according to certain embodiments of the present invention. The method begins at step 402 where client 20 displays to user 16 a list of possible domains 24 stored in client 20 and/or memory 38 of design server 30. From the displayed list of domains 24, user 16 may select one or more domains 24 to be implemented by requested system 14. At step 404, design server 30 may receive from client 20 information regarding one or more selected domains 24. At step 406, client 20 may access target values 18 associated with a plurality of design criteria 22 of requested system 14. Accessing target values 18 may include receiving target values 18 from client 20 associated with user 16 and/or retrieving target values 18 from memory 38 in design server 30. At step 408, design server 30 may identify in memory 38 at least one set of implementation patterns 32 associated with a particular selected domain 24. Each implementation pattern 32 in the identified set may be a possible design option for logically implementing the particular domain 24.

At step 410, processor 42 may input a particular target value 18 received from client 20 into state module 44. State module 44 may operate as a virtual or actual state machine that indicates a current state 48 based at least in part on one or more target values 18 and design rules 34. Each state 48 in state module 44 may correspond to a respective implementation pattern 32 from the identified set of implementation patterns 32 associated with the first selected domain 24. At step 412, state module 44 determines an intermediate or updated state 48 based at least in part on the particular target value 18. Thus, as state module 44 applies target values 18 to design rules 34, state module 44 may update the current state 48.

At step 414, processor 42 determines whether there is at least one remaining target value 18 to be input into state module 44. If processor 42 determines at step 414 that at least one target value 18 remains to be input, the method returns to step 410 where processor 42 inputs target value 18 into state module 44. However, if processor 42 determines at step 414 that no target values 18 remain to be input, then the method continues to step 416 where processor 42 determines the appropriate implementation pattern 32 based at least in part on the current state 48 of state module 44. As described above, each state 48 may correspond to a respective implementation pattern 32 from the identified set of implementation patterns 32. Processor 42 may determine that the appropriate implementation pattern 32 for the selected domain 24 is the particular implementation pattern 32 that corresponds to the current state 48 of state module 44 after each target value 18 has been applied to design rule(s) 34.

At step 418, processor 42 determines whether a particular implementation pattern 32 has been determined for each domain 24 of requested system 14. If processor 42 has not determined a particular implementation pattern 32 for at least one domain 24 of requested system 14, then the method returns to step 408 where processor 42 identifies in memory 38 a set of implementation patterns 32 associated with the at least one remaining domain 24. However, if processor 42 determines at step 418 that a respective implementation pattern 32 has been determined for each domain 24 of requested system 14, then the method proceeds to step 420 where design server 30 determines logical architecture 26 of requested system 14 based at least in part on the determined implementation pattern(s) 32 for each domain 24 of requested system 14. In certain embodiments, determining logical architecture 26 of requested system 14 may include aggregating the respective implementation patterns 32 for each domain 24 into a single architectural plan. According to certain embodiments, determining logical architecture 26 of requested system 14 may further include determining interfaces between two or more of the determined implementation patterns 32.

At step 422, design server 30 may begin to determine physical architecture 28 of requested system 14. In particular, design server 30 may identify in memory 38 at least one set of solution stacks 36 associated with a particular implementation pattern 32 in logical architecture 26. Each solution stack 36 in the identified set may be a possible option for physically embodying the particular implementation pattern 32.

At step 424, processor 42 may input a particular target value 18 received from client 20 into state module 44. At this step, each state 48 in state module 44 may correspond to a respective solution stack 36 from the identified set of solution stacks 36 associated with the particular implementation pattern 32 in logical architecture 26. At step 426, state module 44 may determine an intermediate or updated state 48 based at least in part on the particular target value 18. Thus, as state module 44 applies target values 18 to design rules 34, state module 44 may update its current state 48.

At step 428, processor 42 determines whether all target values 18 have been input into state module 44 (with respect to determining solution stack 36). If processor 42 determines at step 428 that at least one target value 18 remains to be input, the method returns to step 424 where processor 42 inputs target value 18 into state module 44. However, if processor 42 determines at step 428 that no target values 18 remain to be input, then the method continues to step 430 where processor 42 determines the appropriate solution stack 36 based at least in part on the current state 48 of state module 44. As described above, each state 48 of state module 44 may correspond to a respective solution stack 36 from the identified set of solution stacks 36. Processor 42 may determine that the appropriate solution stack 36 for the particular implementation pattern 32 is the particular solution stack 36 that corresponds to the current state 48 of state module 44 after each target value 18 has been applied to design rule(s) 34.

At step 432, processor 42 determines whether a respective solution stack 36 has been determined for each implementation pattern 32 in logical architecture 26 of requested system 14. If processor 42 has not determined a particular solution stack 36 for at least one implementation pattern 32 in logical architecture 26, then the method returns to step 422 where processor 42 identifies in memory 38 a set of solution stacks 36 associated with the at least one remaining implementation pattern 32. However, if processor 42 determines at step 432 that a particular solution stack 36 has been determined for each implementation pattern 32 in logical architecture 26, then the method proceeds to step 434. At step 434, design server 30 determines physical architecture 28 of requested system 14 based at least in part on the respective solution stacks 36 that processor 42 determined for implementation patterns 32 in logical architecture 26. In certain embodiments, determining physical architecture 28 of requested system 14 may include aggregating the determined solution stacks 36 into a single architectural plan. According to certain embodiments, determining physical architecture 28 of requested system 14 may further include determining interfaces between two or more of the determined solution stacks 36. In certain embodiments, design server 30 may transmit to client 20 and/or store in memory 38 the determined logical architecture 26 and/or physical architecture 28 of requested system 14. Client 20 is generally operable to display the determined logical architecture 26 and/or physical architecture 28 to user 16. The method then ends.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A system, comprising:
a memory operable to store a plurality of target values, each target value associated with a respective design criterion of a computer system to be designed, the computer system associated with one or more domains, each domain associated with a respective function of the computer system; and
a processor operable to:
determine, based at least in part on a first set of one or more of the plurality of target values, a respective implementation pattern for each of the one or more domains, the one or more determined implementation patterns representing a logical architecture for the computer system;
determine a physical architecture for the computer system by determining a respective solution stack for each of the one or more determined implementation patterns based at least in part on a second set of one or more of the plurality of target values;
map a first set of implementation patterns to a first domain;
map a second set of implementation patterns to a second domain;
for the first domain, determine a particular implementation pattern from the first set of implementation patterns; and
for the second domain, determine a particular implementation pattern from the second set of implementation patterns.

2. The system of claim 1, wherein the one or more domains comprise at least one of:
a data management domain;
an online transactional domain;
a business intelligence domain; and
an application integration domain.

3. The system of claim 1, wherein at least one design criterion comprises at least one of:
platform type;
number of users;
latency;
authentication type;
frequency of changes to the computer system; and
number of other systems to be integrated with the computer system.

4. The system of claim 1, wherein:
each of the one or more domains is associated with a finite set of implementation patterns; and
each implementation pattern in the finite set comprises a logical architectural option that conforms to one or more rules for computer system design.

5. The system of claim 1, wherein each implementation pattern is generic with respect to hardware and software products in the computer system.

6. The system of claim 1, wherein the one or more determined implementation patterns represent a logical architecture for the computer system, the logical architecture being agnostic with respect to vendor-specific hardware products in the computer system.

7. The system of claim 1, wherein at least one implementation pattern comprises at least one of:
an n-tier framework;
a client-server framework; and
a mainframe system.

8. The system of claim 1, wherein determining, based at least in part on a first set of one or more of the plurality of target values, the respective implementation pattern for a domain comprises:
inputting a first target value, from the first set of one or more of the plurality of target values, to a first state module to determine an intermediate state, the first target value associated with a first design criterion; and
inputting a second target value, from the first set of one or more of the plurality of target values, to a second state module to determine an updated state, the second target value associated with a second design criterion, the determination of the updated state based at least in part on the second target value and the intermediate state.

9. The system of claim 1, wherein:
each implementation pattern is associated with a respective set of solution stacks; and
each solution stack is vendor-specific with respect to hardware in the computer system.

10. The system of claim 1, wherein:
each implementation pattern is associated with a respective set of solution stacks;
a first solution stack for an implementation pattern specifies hardware components from a first vendor;
a second solution stack for the implementation pattern specifies hardware components from a second vendor; and
a third solution stack for the implementation pattern specifies at least one hardware component from the first vendor and at least one hardware component from the second vendor.

11. The system of claim 1, wherein determining the respective solution stack comprises:
inputting a first target value, from the second set of one or more of the plurality of target values, to a first state module to determine an intermediate state, the first target value associated with a first design criterion; and
inputting a second target value, from the second set of one or more of the plurality of target values, to a second state module to determine an updated state, the second target value associated with a second design criterion, the determination of the updated state based at least in part on the second target value and the intermediate state.

12. A method, comprising:
accessing a plurality of target values, each target value associated with a respective design criterion of a computer system to be designed, the computer system associated with one or more domains, each domain associated with a respective function of the computer system;
determining, based at least in part on a first set of one or more of the plurality of target values, a respective implementation pattern for each of the one or more domains, the one or more determined implementation patterns representing a logical architecture for the computer system;
determining a physical architecture for the computer system by determining a respective solution stack for each of the one or more determined implementation patterns based at least in part on a second set of one or more of the plurality of target values;
mapping a first set of implementation patterns to a first domain;
mapping a second set of implementation patterns to a second domain;
for the first domain, determining a particular implementation pattern from the first set of implementation patterns; and
for the second domain, determining a particular implementation pattern from the second set of implementation patterns.

13. The method of claim 12, wherein at least one design criterion comprises at least one of:
platform type:
number of users;
latency;
authentication type;
frequency of changes to the computer system; and
number of other systems to be integrated with the computer system.

14. The method of claim 12, wherein:
each of the one or more domains is associated with a finite set of implementation patterns; and
each implementation pattern in the finite set comprises a logical architectural option that conforms to one or more rules for computer system design.

15. The method of claim 12, wherein each implementation pattern is generic with respect to hardware and software products in the computer system.

16. The method of claim 12, wherein determining, based at least in part on a first set of one or more of the plurality of target values, a respective implementation pattern for a domain comprises:
inputting a first target value, from the first set of one or more of the plurality of target values, to a first state module to determine an intermediate state, the first target value associated with a first design criterion; and
inputting a second target value, from the first set of one or more of the plurality of target values, to a second state module to determine an updated state, the second target value associated with a second design criterion, the determination of the updated state based at least in part on the second target value and the intermediate state.

17. The method of claim 12, wherein:
each implementation pattern is associated with a respective set of solution stacks; and
each solution stack is vendor-specific with respect to hardware in the computer system.

18. The method of claim 12, wherein the first set of one or more of the plurality of target values is different from the second set of one or more of the plurality of target values.

19. Logic embodied in computer-readable media, the logic operable when executed by a processor to:
access a plurality of target values, each target value associated with a respective design criterion of a computer system to be designed, the computer system associated with one or more domains, each domain associated with a respective function of the computer system;
determine, based at least in part on a first set of one or more of the plurality of target values, a respective implementation pattern for each of the one or more domains, the one or more determined implementation patterns representing a logical architecture for the computer system;
determine a physical architecture for the computer system by determining a respective solution stack for each of the one or more determined implementation patterns based at least in part on a second set of one or more of the plurality of target values;
map a first set of implementation patterns to a first domain;
map a second set of implementation patterns to a second domain;
for the first domain, determine a particular implementation pattern from the first set of implementation patterns; and
for the second domain, determine a particular implementation pattern from the second set of implementation patterns.

* * * * *